(12) United States Patent
Nakahara

(10) Patent No.: US 7,718,450 B2
(45) Date of Patent: May 18, 2010

(54) METHOD FOR MANUFACTURING NITRIDE SEMICONDUCTOR DEVICE

(75) Inventor: Ken Nakahara, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 209 days.

(21) Appl. No.: 11/920,043

(22) PCT Filed: May 8, 2006

(86) PCT No.: PCT/JP2006/309241

§ 371 (c)(1),
(2), (4) Date: Nov. 8, 2007

(87) PCT Pub. No.: WO2006/120999

PCT Pub. Date: Nov. 16, 2006

(65) Prior Publication Data

US 2009/0068779 A1    Mar. 12, 2009

(30) Foreign Application Priority Data

May 9, 2005   (JP)   ............................. 2005-136179

(51) Int. Cl.
*H01L 21/00* (2006.01)

(52) U.S. Cl. ............................. 438/22; 438/46; 438/77; 438/795; 257/102; 257/E33.025; 257/E33.028; 257/E33.033

(58) Field of Classification Search .................. 438/22, 438/46, 77, 93, 795; 257/E33.025, E33.028, 257/E33.033, 102
See application file for complete search history.

(56) References Cited

U.S. PATENT DOCUMENTS 6,881,261 B2 *   4/2005   Ueda ........................... 117/89

FOREIGN PATENT DOCUMENTS

| JP | 08-051235 | 2/1996 |
| JP | 11-274557 | 10/1999 |
| JP | 2000-058919 | 2/2000 |
| JP | 2002-289550 | 10/2002 |

* cited by examiner

OTHER PUBLICATIONS

A. Yoshida, et al., "Epitaxial growth of nitride semiconductor films by laser ablation", Thin Solid Films, vols. 343-344, Apr. 1999, pp. 127-129.

*Primary Examiner*—Hsien-ming Lee
(74) *Attorney, Agent, or Firm*—Rabin & Berdo, PC

(57) ABSTRACT

There is provided a method for manufacturing a nitride semiconductor device which has a p-type nitride semiconductor layer having a high carrier concentration (low resistance) by activating an acceptor without raising a problem of forming nitrogen vacancies which are generated when a high temperature annealing is carried out over an extended time. A semiconductor lamination portion (6) made of nitride semiconductor is formed on a substrate (1) so as to form a light emitting layer, and irradiated by a laser beam having a wavelength λ of λ=h·c/E or less (E is energy capable of separating off the bonding between Mg and H) from the front surface side of the semiconductor lamination portion. Then, a heat treatment is carried out at a temperature of 300 to 400° C. And, similarly to a process for normal nitride semiconductor LED, a light transmitting conductive layer (7) is provided, an n-side electrode (9) is formed on an n-type layer (3) exposed by removing a part of the semiconductor lamination portion by etching, and a p-side electrode (8) is formed on a surface of the light transmitting conductive layer, thereby a LED is obtained.

9 Claims, 3 Drawing Sheets

(a)

(b)

(c)

(d)

(e)

METHOD FOR MANUFACTURING NITRIDE SEMICONDUCTOR DEVICE

FIELD OF THE INVENTION

The present invention relates to a method for manufacturing a semiconductor device using a p-type nitride semiconductor crystal layer such as a light emitting device like a light emitting diode (LED), a laser diode or the like, and a transistor device like a HEMT or the like, using nitride semiconductor. More particularly, the present invention relates to a method for a nitride semiconductor device in which an acceptor can be surely activated and a p-type layer of a low resistance can be obtained, without bringing on a bad effect of nitrogen loss caused by carrying out a heat treatment at a high temperature in order to activate an acceptor in the p-type nitride semiconductor layer.

BACKGROUND OF THE INVENTION

Nitride semiconductor light emitting devices such as a blue light emitting diode (LED), a laser diode or the like, using nitride semiconductor have been lately in practical use. The semiconductor light emitting device using nitride semiconductor and emitting blue light is formed by laminating, for example on a sapphire substrate, in order by MOCVD method, a low temperature buffer layer made of GaN or the like, an n-type layer made of GaN or the like, an active layer (light emitting layer) made of material, for example InGaN based (which means that a ratio of In to Ga can be varied variously and the same applies hereinafter) compound semiconductor, which has a smaller band gap energy than that of the n-type layer and decides a wavelength of emitted light and a p-type layer made of GaN or the like. And a p-side electrode is formed over a surface thereof interposing a light transmitting conductive layer, and an n-side electrode is formed on a surface of the n-type layer exposed by etching a part of the semiconductor lamination portion. Additionally, a semiconductor layer having still larger band gap energy such as AlGaN based (which means that a ratio of Al to Ga can be varied variously and the same applies hereinafter) compound or the like may be employed on an active layer side of the n-type layer and the p-type layer in order to increase an effect of carrier confinement.

When the nitride semiconductor layers are laminated by the MOCVD method, since Mg which is introduced as an acceptor of a p-type layer is apt to be combined with H because raw material gas contains hydrogen of an alkyl group, carrier gas is hydrogen and $NH_3$ which is raw gas of nitrogen contains hydrogen, then the Mg is taken in the semiconductor layers in a form of Mg—H, while combining with H. When Mg and H exist combined in a semiconductor layer, the Mg is inactivated and can not function as an acceptor. Therefore, an annealing treatment is generally carried out in an atmosphere of a temperature of 400° C. or more and not containing hydrogen, in the prior art, and the Mg as an acceptor is activated by separating off Mg and H by heat and dispersing the H out of the nitride semiconductor layer (cf. for example PATENT DOCUMENT 1).

In this case, a laser annealing treatment carried out by irradiating a laser beam has been employed for the annealing (cf. for example PATENT DOCUMENT 2). When annealing is carried out by the laser annealing method, since a temperature only in the vicinity of a p-type layer can be raised without raising a temperature of whole semiconductor lamination portion, there is an advantage such that diffusion of dopants into an active layer or the like is easily inhibited. Although a laser beam of a short wavelength is required to be used from necessity of raising a temperature of a nitride semiconductor layer since GaN has a high absorption coefficient at a short wavelength corresponding to a band gap energy Eg or more because GaN is direct transition semiconductor, a depth of entering of a laser beam into the nitride semiconductor layer becomes small, and it becomes difficult to activate a thick p-type nitride semiconductor layer.

PATENT DOCUMENT 1: Japanese Patent Application Laid-Open No. HEI8-51235

PATENT DOCUMENT 2: Japanese Patent Application Laid-Open No. 2002-289550

DISCLOSURE OF THE INVENTION

Problem to be Solved by the Present Invention

As described above, in a p-type nitride semiconductor layer grown by MOCVD method, Mg doped as an acceptor can not be activated and can not function as an acceptor without an annealing treatment at a high temperature of 400° C. or more. However, when the annealing treatment at a high temperature of 400° C. or more is carried out in order to separate off a bonding between the Mg and H, and to disperse the H, nitrogen in a surface of the nitride semiconductor layer becomes apt to be dispersed and a phenomenon of nitrogen loss occurs. When nitrogen loss occurs, a nitrogen vacancy is formed, the nitrogen vacancy acts as a donor and lowers a concentration of holes, and finally there arises a problem such that the p-type layer with a high carrier concentration can not be obtained.

The present invention is directed to solve the above-described problem and an object of the present invention is to provide a method for manufacturing a nitride semiconductor device which has a p-type nitride semiconductor layer having a high carrier concentration (low resistance) by activating an acceptor without raising a problem of forming nitrogen vacancies which are generated when a high temperature annealing is carried out over an extended time.

Another object of the present invention is to provide a method for manufacturing a nitride semiconductor device in which nitride semiconductor layers with less crystal defects can be grown and a p-type layer can be formed in still lower resistance, even though nitride semiconductor layers are laminated on a substrate which is not lattice-matched with nitride semiconductor.

Means for Solving the Problem

A method for manufacturing a nitride semiconductor device according to the present invention is a method for manufacturing a nitride semiconductor device in which a p-type nitride semiconductor layer is formed at a surface side of nitride semiconductor layers grown on a substrate by MOCVD method, including the steps of; irradiating a laser beam having energy larger than binding energy of Mg which is an acceptor of the nitride semiconductor, and H, on a nitride semiconductor layer doped with the acceptor to make the p-type layer activate, thereby separating off a bonding between the Mg and the H, and dispersing the H separated off out of the nitride semiconductor layer by carrying out a heat treatment at a temperature of 300 to 400° C., thereby activating the acceptor.

Here, the nitride semiconductor means a compound of Ga of group III element and N of group V element or a compound (nitride) in which a part or all of Ga of group III element is substituted by other element of group III element like Al, In or the like and/or a part of N of group V element is substituted by other element of group V element like P, As or the like.

Concretely, the light emitting device can be formed by forming a semiconductor lamination portion so as to form a light emitting layer by growing epitaxially an n-type layer, an active layer and a p-type layer in this order, made of nitride semiconductor, on the substrate by MOCVD method, irradiating a laser beam having energy corresponding to λ or less in an equation λ=h·c/E, λ representing an oscillation wavelength of the laser, h a Planck's constant, c a light velocity and E energy capable of separating off a bonding between the Mg and the H, from a surface side of the semiconductor lamination portion, and carrying out a heat treatment at a temperature of 300 to 400° C., thereafter.

Besides the above-described constitution in the method for manufacturing the nitride semiconductor device according to the present invention, a nitride semiconductor device which has a p-type nitride semiconductor layer having a higher carrier concentration (low resistance) can be obtained by growing a buffer layer of single crystal made of $Al_xGa_yIn_{1-x-y}N$ ($0 \leq x \leq 1$, $0 \leq y \leq 1$ and $0 \leq x+y \leq 1$), in which a-axis and c-axis of the $Al_xGa_yIn_{1-x-y}N$ are aligned, on a surface of a substrate which is not lattice-matched with nitride semiconductor, by PLD method, and by growing a nitride semiconductor crystal layer on the buffer layer of single crystal by MOCVD method, since crystal defects decrease by being combined to inhibiting occurrence of nitrogen vacancies.

Here, the lattice-mismatched substrate with nitride semiconductor means a substrate having a relationship represented by next inequality.

(difference of lattice constants of *a*-axis direction between nitride semiconductor and a substrate)/(a lattice constant of *a*-axis direction of the nitride semiconductor)≧0.5%

Effect of the Invention

According to the present invention, since a bonding between the acceptor, for example Mg, doped into the nitride semiconductor layer and H is separated off by irradiating a laser beam and a heat treatment is carried out at a low temperature of 300 to 400° C. thereafter, the separated H can be easily dispersed out of the nitride semiconductor layer. As a result, nitrogen vacancies caused by decomposing of nitrogen from a surface of the nitride semiconductor layer are not formed because it is not necessary to carry out a heat treatment at a high temperature for an extended time in order to activate the acceptor only by an annealing treatment. Thereby, since activation of, for example, Mg of an acceptor can be carried out surely, because of no decrease of a hole concentration by nitrogen vacancies, a p-type layer with remarkably high carrier concentration and with a low specific resistance can be obtained, and, as a result, the nitride semiconductor device can be obtained such as semiconductor light emitting device with high performance or the like.

EXPLANATION OF LETTERS AND NUMERALS

Figure 1:
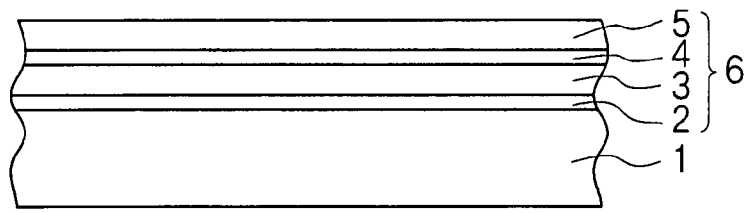
FIG. 1 is an explanatory cross-sectional view showing a manufacturing process of a light emitting device which is an embodiment of the method for manufacturing a nitride semiconductor device according to the present invention.
Figure 1:
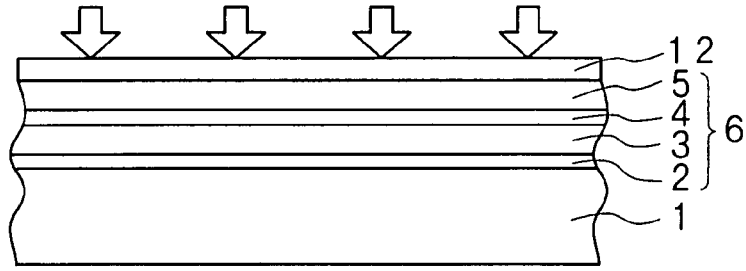
Figure 1:
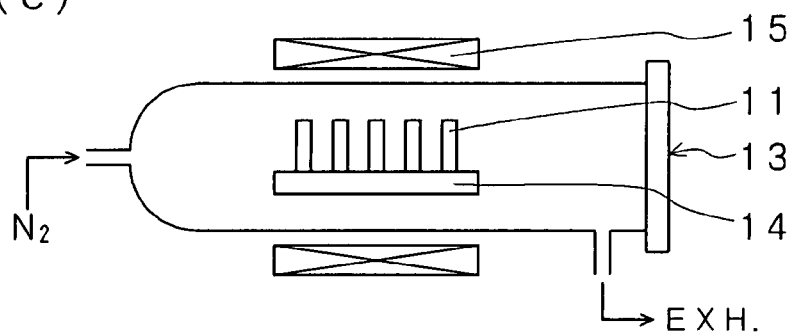
Figure 1:
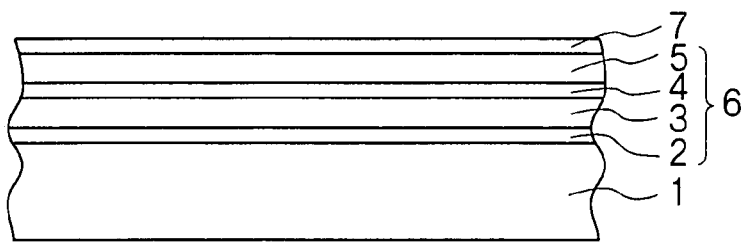
Figure 1:
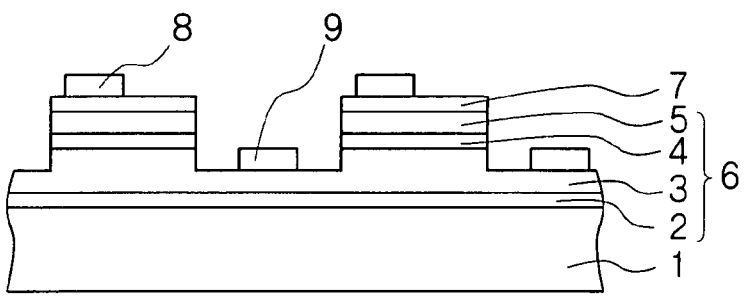

1: substrate
2: low temperature buffer layer
3: n-type layer
4: active layer
5: p-type layer
6: semiconductor lamination portion
7: light transmitting conductive layer
8: p-side electrode
9: n-side electrode
10: single crystal buffer layer

THE BEST EMBODIMENT OF THE PRESENT INVENTION

An explanation will be given below of a method for manufacturing a nitride semiconductor device according to the present invention in reference to the drawings. In case that a nitride semiconductor device is formed which has a p-type nitride semiconductor layer formed at a surface side of nitride semiconductor layers grown on a substrate by MOCVD method, the method for manufacturing a nitride semiconductor device according to the present invention includes the steps of: irradiating a laser beam having energy capable of separating off a bonding between Mg which is an acceptor and H, on a nitride semiconductor layer doped with the acceptor to make the p-type layer activate, thereby separating off the bonding between the Mg and the H; and dispersing the H separated off out of the nitride semiconductor layer by carrying out a heat treatment at a temperature of 300 to 400° C., thereby activating the acceptor.

Figure 2:
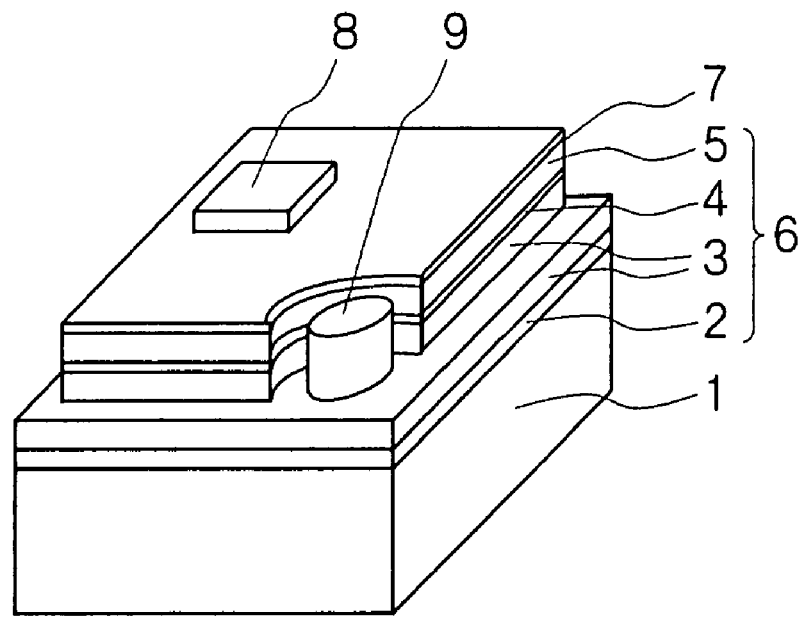
FIG. 2 is an explanatory perspective view of a nitride semiconductor light emitting device chip which is manufactured by the method of FIG. 1.

Concretely, as an explanatory cross-sectional view of a manufacturing process of a nitride light emitting device (LED) which is an embodiment of the method, is shown in FIG. 1 and as an explanatory perspective view of the nitride semiconductor light emitting device chip is shown in FIG. 2, respectively, a semiconductor lamination portion 6 is formed (cf. FIG. 1(a)) by growing epitaxially an n-type layer 3, an active layer 4 and a p-type layer 5 in this order, made of nitride semiconductor, on a substrate 1 by MOCVD method so as to form a light emitting layer, and a laser beam having energy corresponding to λ or less in an equation λ=h·c/E, (here, λ represents an oscillation wavelength of the laser, h a Planck's constant, c a light velocity and E energy capable of separating off a bonding between the Mg and the H) is irradiated (cf. FIG. 1(b)) from a surface side of the semiconductor lamination portion 6. Thereafter, a heat treatment is carried out (cf. FIG. 1(c)) at a temperature of 300 to 400° C. The subsequent steps are same as those in a production process of normal nitride semiconductor LEDs. That is, a light transmitting conductive layer 7 made of ZnO, ITO or the like is formed on a surface of the semiconductor lamination portion 6 (cf. FIG. 1(d)), an n-side electrode 9 is formed on the n-type layer 3 exposed by etching a part of the semiconductor lamination portion 6 and a p-side electrode 8 is formed on a surface of the light transmitting conductive layer 7 respectively (cf. FIG.

1(*e*)). Thereafter, a wafer is divided into chips, thereby a chip of a nitride semiconductor light emitting device as shown in FIG. 2 is obtained.

Since Mg of an acceptor which is doped into the p-type layer 5 exists combined with H contained in organic metal compound, ammonia of raw material gas or carrier gas, in growing semiconductor layers, a laser beam is irradiated in order to separate off a bonding thereof. As a result of earnest and repeated study and examination by the present inventor, it is found that the bonding between Mg and H can be separated off by irradiating a laser beam having energy of 0.067 eV or more. In other words, the laser beam to give the energy E has a wavelength of $\lambda = h \cdot c/E\lambda = 18$ μm, $\lambda$ being a wavelength. Here, h is a Planck's constant and c a light velocity. When the wavelength is shorter than this value, energy becomes larger, finally, the bonding between the Mg and the H can be separated by irradiating the laser beam having a wavelength $\lambda$ of 18 μm or less. As a result, irradiation of a laser beam having a wavelength of 365 nm or more corresponding to band gap energy of 3.39 eV or less is preferable and the bonding between the Mg and the H can be separated off not by heating nitride semiconductor layers but by energy of the laser beam.

Namely, when attempting to activate an acceptor by a laser annealing treatment, it is necessary to change the energy of the laser beam into heat by being absorbed in nitride semiconductor layers. Since, for example, a band gap energy of GaN is 3.39 eV which is corresponding to a wavelength of 365 nm, a KrF laser oscillating at a wavelength of 248 nm, an ArF laser of 193 nm, or the like, which has a shorter wavelength than the above described wavelength of 365 nm, should be used and whole semiconductor layers are heated. However, according to the present invention, since only energy for separating off a bonding between Mg and H is required, for example, a YAG laser (yttrium aluminum garnet with added Nd) of a wavelength of 1.064 μm, a $CO_2$ laser of 10.5 μm, a semiconductor laser of 0.8 μm or the like, can be used, and the Mg and the H are separated off without heating nitride semiconductor layers.

In addition, in case that a whole wafer can not be set within an irradiation area of a laser beam at the time of laser beam irradiation, the laser beam may be scanned. At that time, laser beam irradiation of approximately 0.05 w/cm$^2$ or more is carried out. And, the laser beam is preferably used without being condensed, because nitrogen vacancies are apt to arise by ablation of GaN when the laser beam is condensed as in an ablation apparatus.

A subsequent heat treatment is carried out for dispersing H generated by separating off a bonding of Mg—H by laser beam irradiation described above. Namely, as described above, since the laser beam irradiation is carried out with an object of separating off the bonding between the Mg and the H, a temperature of semiconductor layers is not raised, and the H remains in nitride semiconductor layers as it is even if the H is separated off by the laser beam irradiation. If the H is left as it is, activation of the Mg decreases by combining again because Mg is apt to combine with H. Then, although, a heat treatment is carried out for dispersing the H separated off out of the nitride semiconductor layers, its object is only to disperse the H which is already separated off from a bonding with the Mg, and the H already separated off from the Mg can be dispersed easily by carrying out a heat treatment at a comparatively low temperature of approximately 300 to 400° C. for approximately 1 to 10 min in an atmosphere not containing hydrogen, for example, such as a nitrogen atmosphere or the like. Thereby, since a conventional heat treatment is not necessary which is carried out at a temperature of 400° C. or more for a long period of 20 min or more for separating off bonding of Mg—H and dispersing the H, there are no bad effects such as diffusion of dopants in the semiconductor lamination portion or occurrence of nitrogen vacancies generated by separating of nitrogen from a surface of the semiconductor lamination portion. In addition, growing of semiconductor layers or the like is carried out similarly to a usual manufacturing process except the heat treatment.

Subsequently, a more detail explanation of a method for manufacturing the nitride semiconductor light emitting device according to the present invention will be given below by using a concrete example, in reference to FIG. 1. Substrates of various kinds may be used for the substrate 1, such as the substrate made of sapphire, SiC, GaN based compound (means nitride semiconductor), ZnO based compound (means oxides containing Zn), Si, GaAs or the like. At first, the substrate 1 made of, for example, sapphire is set within a MOCVD apparatus and a thermal cleaning of the substrate 1 is carried out by raising a temperature to approximately 1050° C. while supplying hydrogen gas. Thereafter, for example, a low temperature buffer layer 2 made of, for example, GaN is formed in a thickness of approximately 0.005 to 0.1 μm at a temperature lowered to approximately 400 to 600° C., then, the n-type layer 3 is laminated in a thickness of approximately 1 to 10 μm by growing a contact layer made of GaN doped with Si, and a super lattice layer made of InGaN-based-compound/GaN, a temperature being raised to a high temperature of approximately 600 to 1200° C., for example 1000° C. And, at a lowered temperature of approximately 400 to 600° C., the active layer 4 is formed in a thickness of approximately 0.05 to 0.3 μm, which is a MQW made of undoped InGaN based compound and GaN (a structure of a multiple quantum well formed by laminating 3 to 8 pairs of a well layer made of, for example, $In_{0.17}Ga_{0.83}N$ and having a thickness of 1 to 3 nm, and a barrier layer made of $In_zGa_{1-z}N$ ($0 \leq z \leq 0.05$) and having a thickness of 10 to 20 nm). And, the p-type layer 5 made of GaN doped with Mg is grown in a thickness of approximately 0.01 to 0.5 μm by raising a temperature within a growth furnace to approximately 600 to 1200° C., for example approximately 1000° C.

At the time of forming each layer of the above-described semiconductor layers, a semiconductor layer with a desired composition, a desired conductivity type and a desired thickness can be formed by supplying necessary gasses, with $H_2$ for a carrier gas, such as a reactant gas like trimethyl gallium (TMG), ammonia ($NH_3$), trimethyl aluminium (TMA), trimethyl indium (TMIn) or the like, and a dopant gas such as $SiH_4$ for making an n-type, or a dopant gas such as biscyclopentadienyl magnesium ($Cp_2Mg$).

It is more desirable that, as shown in FIG. 1(*b*), a laser beam is irradiated thereafter as described above by forming a protection film 12 made of $SiO_2$ or the like having a thickness of approximately 0.1 to 1 μm on a surface of the semiconductor lamination portion 6 by CVD method or the like (arrow signs in the figure show laser beam irradiation). It is preferable to form the protection film 12 because nitrogen loss of nitride semiconductor layers can be inhibited, however the protection film 12 may not be used because a temperature of nitride semiconductor layers is not raised so high by laser beam irradiation, as described above. The laser beam irradiation is carried out without condensing the beam as described above, the laser beam is irradiated for approximately 15 min in case of irradiating a whole area of a wafer at once, and the laser beam is scanned such that the same place is irradiated for the same period as described above in case that a whole area of a wafer can not be irradiated at once.

Thereafter, as shown by a schematic figure of FIG. 1(*c*), a heat treatment carried out for approximately 1 to 10 min by setting a wafer 11 on a work carrier 14 in a heating apparatus such as, for example, a MOCVD apparatus 13 or the like, and raising temperature of the wafer 11 to approximately 300 to 400° C. by turning a heater 15 on, while flowing nitrogen gas. EXH. in FIG. 1(c) means an exhaust outlet for dispersing gas. In this example, although a laser beam irradiation and a heat treatment are carried out successively, the laser beam irradiation and the heat treatment can be carried out spontaneously by constituting a heating apparatus in which the laser beam irradiation can be directly carried out, and H separated by the laser beam irradiation can be immediately dispersed out of nitride semiconductor layers. Then, as shown in FIG. 1(d), a light transmitting conductive layer 7 made of, for example, ZnO or the like, and able to make ohmic contact with the p-type semiconductor layer 5 is formed in a thickness of 0.01 to 5 μm on a surface of the semiconductor lamination portion 6, after removing the protection film 12. As the light transmitting conductive layer 7 is not limited to ZnO, ITO or a thin alloy layer of Ni and Au having a thickness of approximately 2 to 100 nm can be used and diffuse electric current to whole part of a chip while transmitting light.

Subsequently, as shown in FIG. 1(e), the n-type layer 3 is exposed by removing a part of the light transmitting conductive layer 7 and the semiconductor lamination portion 6 by dry etching in order to form the n-side electrode. And, the p-side electrode 8 having a lamination structure of Ti and Au is formed on a part of the light transmitting conductive layer 7 by using a lift-off method, and the n-side electrode 9 for ohmic contact is formed of Ti—Al alloy or the like on the exposed surface of the n-type layer 3. As a result, a LED chip shown in FIG. 2 is formed by dividing the wafer into chips.

In the above-described example, the p-type layer 5 is formed with a single layer made of GaN, however a layer having a large band gap energy such as AlGaN may be formed at, for example, the active layer side. In this case, a bonding between Mg and H can be separated off by using a laser beam having a similar wavelength to that described above, too. And the n-type layer 3 may be formed by multiple layers of two or more kinds. Although, in the above-described example, a double hetero junction structure is shown in which the active layer 15 is sandwiched by the n-type layer 14 and the p-type layer 16, a structure of a p-n junction may be used in which the n-type layer and the p-type layer are directly joined. And although the above-described example is an example of a LED, a laser diode can be formed by forming a light emitting region of a stripe shape in a similar manner.

In the nitride semiconductor light emitting device formed in such manner, activation of the p-type layer is carried out by separating off a bonding between Mg of an acceptor and H or the like by a laser beam, and dispersing the H separated off by a heat treatment thereafter. Thereby, since the heat treatment can be carried out at a remarkably low temperature and for a short period, a semiconductor light emitting device such as a LED, a semiconductor laser or the like, with high stability and high performance can be obtained, because, while attempting to activate the p-type layer surely, generation of nitrogen vacancies can be inhibited by inhibiting separation of nitrogen from a surface of the semiconductor lamination portion and diffusion of dopants or the like between the semiconductor layers laminated can be inhibited by not requiring a heat treatment at a high temperature.

Figure 3:
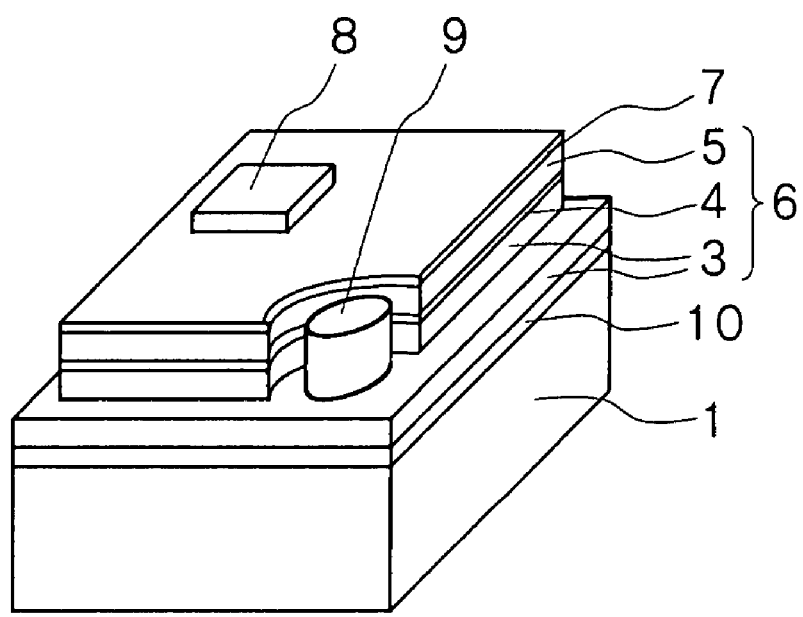
FIG. 3 is an explanatory perspective view of a light emitting device chip which is manufactured by another embodiment of the method for manufacturing a nitride semiconductor device according to the present invention.

In the example described above, although a low temperature buffer layer made of GaN or the like is formed directly on the sapphire substrate and the n-type layer or the like is formed thereon, the sapphire substrate is lattice-mismatched with a nitride semiconductor layer made of GaN or the like with a difference of approximately 18% in a lattice constant. When the nitride semiconductor layers are laminated on a lattice-mismatched substrate, crystal defects such as dislocations are apt to arise and the crystal defects extend upward in a semiconductor lamination portion as penetrating dislocations, therefor, there are cases of not improving carrier concentration thoroughly even bad effects like nitride vacancies are avoided by a low temperature heat treatment. Even in case of laminating nitride semiconductor layers on a lattice-mismatched substrate, a method capable of lowering a specific resistance of the p-type layer further by inhibiting crystal defects in the nitride semiconductor layers is shown in FIG. 3.

Namely, for example, a sapphire substrate 1 which is not lattice-matched with nitride semiconductor is firstly set within a PLD (Plasma Laser Deposition) apparatus and thermally cleaned at a temperature of approximately 600 to 800° C. A GaN single crystal buffer layer 10 is grown on the sapphire substrate 1 by ablating, for example, a GaN target by a KrF laser. Then, after transferring a wafer into a MOCVD apparatus, the semiconductor lamination portion 6 such as the n-type layer 3 or the like is formed similarly to an example shown in FIG. 1. Thereafter, the p-type layer with remarkably high carrier concentration and with a low specific resistance can be formed, similarly to the example described above, by separating off the bonding between Mg of the acceptor and H or the like by the laser beam, and by dispersing the H separated off out of the nitride semiconductor layers by a heat treatment at the low temperature of 300 to 400° C., and, as a result, the semiconductor light emitting device with high performance can be obtained. In case of a semiconductor laser, a semiconductor laser having a small threshold current and an elongated life time can be obtained.

It has been discovered separately by the present inventor and disclosed in Japanese Patent Application No. 2005-19522 that such single crystal layer in which a-axis and c-axis of GaN are orientated can be formed on the sapphire substrate 1. And the discovery is based on a property of PLD method in which a single crystal layer, in which not only c-axis but also a-axis is aligned, can be obtained by depositing floating materials, which are ablated and float freely, on the substrate, and by raising a temperature of the substrate to approximately 500 to 1,000° C. so that atoms deposited on the substrate can move freely. The PLD method has a feature capable of growing a thin crystal film, since difference in composition between a target and the thin film is small and particles having a high energy caused by self bias are not generated. Furthermore, the PLD method can grow single crystal of a nitride semiconductor layer on a surface of the substrate lattice-mismatched with the nitride semiconductor without forming a low temperature buffer layer, since, in the PLD method like a kind of physical deposition, a film can be formed on a material such as a sapphire substrate not wettable for GaN because a GaN molecule exists in a sublimation material and since crystal growth can be carried out also while keeping an apparatus in high vacuum.

In addition, as a composition of the single crystal buffer layer 10 is not limited to the above described GaN, by using a compound represented by $Al_xGa_yIn_{1-x-y}N$ ($0 \leq x \leq 1$, $0 \leq y \leq 1$ and $0 \leq x+y \leq 1$) for a target, the single crystal buffer layer 10 having the composition thereof can be formed. Then, it is desirable that a single crystal buffer layer 10 having a desired composition is formed depending on nitride semiconductor layers to be laminated thereon.

Figure 4:
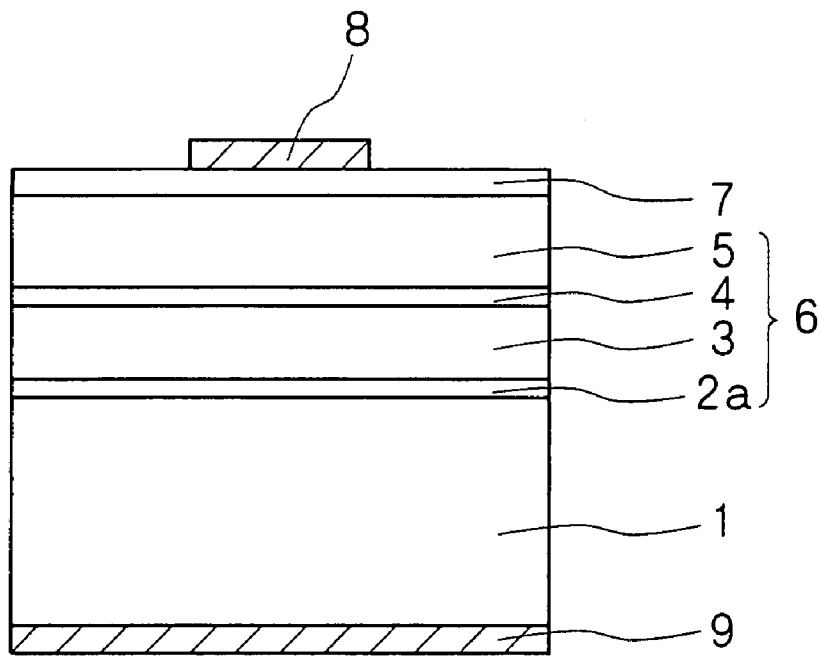
FIG. 4 is an explanatory cross-sectional view showing another constitution example of the nitride semiconductor light emitting device.

Although, in the above-described example, the n-side electrode 9 is formed by exposing the n-type layer 3 by etching a part of the semiconductor lamination portion 6, because the substrate is the sapphire substrate of an insulating substrate, the p-type layer having a remarkably low resistance can be obtained by irradiating a laser beam similarly from a surface side of the semiconductor lamination portion 6 and by carrying out a heat treatment at a temperature of approximately 300 to 400° C. even in case that the substrate is a semiconductor substrate such as SiC. The example is shown in FIG. 4. In this example, since a substrate is not an insulating substrate but a semiconductor substrate, the n-side electrode 9 is not formed on the n-type layer 3 exposed by removing a part of the semiconductor lamination portion by etching, but simply formed on a back surface of the semiconductor substrate 1, and other processes are similar to those of the above-described example.

Namely, a high temperature buffer layer 2a made of AlGaN based compound is grown on the substrate 1 made of SiC, thereafter, in the same manner described above, the semiconductor lamination portion 6 composed of the n-type layer 3, the active layer 4 and the p-type layer 5 is formed and, after activating the p-type layer 5, the light transmitting conductive layer 7 is formed on the surface thereof. In this case, the p-side electrode 8 is formed on the surface of the light transmitting conductive layer 7 approximately at a center of the chip by using same material as described above, and the n-side electrode 9 is formed on the whole back surface of the SiC substrate 1 by forming, for example, a Ni film. In this case, since the SiC substrate and nitride semiconductor layers are not lattice-matched with each other, as shown in FIG. 3 described above, the p-type layer having more excellent crystallinity and a low resistance can be formed by growing firstly a single crystal buffer layer made of $Al_xGa_yIn_{1-x-y}N$ on the substrate by PLD method and laminating each of nitride semiconductor layers thereon by MOCVD method.

Figure 5:
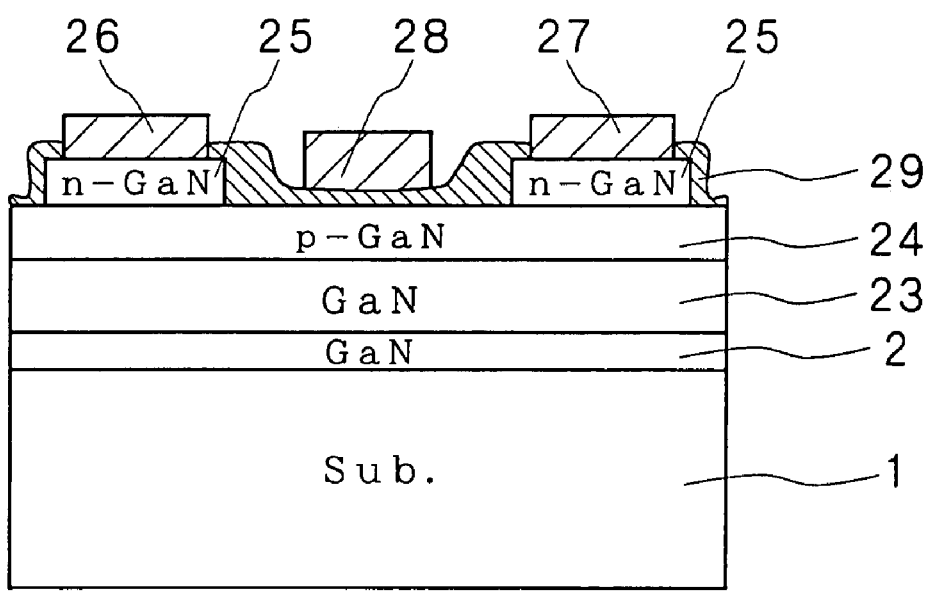
FIG. 5 is an explanatory cross-sectional view of a constitution of a transistor which is formed by the present invention.

FIG. 5 is a cross-sectional view explaining a transistor constituted by using a p-type layer formed by the above described method. In the same manner as a case of the light emitting device, a substrate 1 is set within a MOCVD apparatus, necessary organic metal gasses are supplied in the same manner as described above, and there are formed, in order, a GaN buffer layer 2, an undoped GaN layer 23 approximately 4 μm thick, and an electron transit layer 24 made of n-type GaN approximately 10 nm thick. Thereafter, the p-type electron transit layer 24 (operation layer) having a low resistance can be formed by separating a bonding between the acceptor and H or the like, by irradiating the laser beam, and dispersing the H separated off by carrying out the heat treatment at a temperature of approximately 300 to 400° C. Then, an n-type GaN layer 25 is grown in a thickness of approximately 5 nm, and the electron transit layer 24 is exposed by etching and removing a part of the n-type GaN layer 25 so as to provide a predetermined distance of approximately 1.5 μm to be a gate length. And, an insulating film 29 made of AlN or SiN is formed in a thickness of approximately 10 nm and a part of the n-type GaN layer 25 is exposed by etching. Finally, an n-channel transistor is constituted by forming a source electrode 26 and a drain electrode 27 made of, for example, a Ti film and an Au film on the n-type GaN layer 25 exposed, and by forming a gate electrode 28 formed by laminating, for example, a Pt film and an Au film, on a surface of an insulating film 29 between the electrodes. In this case, since a single crystal buffer layer can be formed on a substrate, by growing GaN layers theron, a nitride semiconductor layer with an excellent crystallinity can be formed and a transistor (HEMT) with a small leakage current and high break down voltage can be obtained.

INDUSTRIAL APPLICABILITY

Characteristics of a light emitting device using nitride semiconductor, such as a LED and laser diode, and a transistor device such as a HEMT can be improved and the nitride semiconductor device can be used in every kinds of electronic apparatus using the nitride semiconductor device.

What is claimed is:

1. A method for manufacturing a nitride semiconductor device, wherein the nitride semiconductor device comprises a plurality of nitride semiconductor layers having an uppermost p-type nitride semiconductor layer in the plurality of nitride semiconductor layers, the method comprises the steps of:
   utilizing an MOCVD method to grow the plurality of nitride semiconductor layers including the uppermost p-type nitride semiconductor layer;
   irradiating a laser beam having a wavelength of 0.8 μm to 18 μm, which has an energy larger than a binding energy of Mg and H, on a surface of the p-type nitride semiconductor layer to activate the uppermost p-type nitride semiconductor layer, thereby separating off a bonding between the Mg and the H, wherein Mg is doped in the uppermost p-type nitride semiconductor layer and is an acceptor of the uppermost p-type nitride semiconductor layer and wherein H is absorbed by the uppermost p-type nitride semiconductor layer during growing the plurality of nitride semiconductor layer in MOCVD method; and
   dispersing the H that is separated from the p-type nitride semiconductor layer by carrying out a heat treatment at a temperature of between about 300 and about 400° C., to activate the acceptor.

2. The method for manufacturing a nitride semiconductor device according to claim 1, wherein the laser beam has energy corresponding to λ or less in an equation λ=h·c/E, λ representing an oscillation wavelength of the laser, h a Planck's constant, c a light velocity and E energy capable of separating off a bonding between the Mg and the H.

3. The method for manufacturing a nitride semiconductor device according to claim 1, wherein the laser beam is obtained by any one of a YAG laser with added Nd, a $CO_2$ laser, and a semiconductor laser having a wavelength of 0.8 μm.

4. The method for manufacturing a nitride semiconductor device according to claim 1, wherein the laser beam is directly irradiated on the p-type nitride semiconductor layer without being condensed.

5. The method for manufacturing a nitride semiconductor device according to claim 1, wherein the heat treatment is carried out for 1 to 10 min.

6. The method for manufacturing a nitride semiconductor device according to claim 1, wherein the laser beam irradiation and the heat treatment are carried out concurrently.

7. The method for manufacturing a nitride semiconductor device according to claim 1, wherein the method further comprises epitaxially growing an n-type nitride semiconductor layer, an active semiconductor layer and the p-type nitride semiconductor layer on the substrate by MOCVD method in a sequential order, to form a semiconductor lamination portion for a light emitting device.

8. The method for manufacturing a nitride semiconductor device according to claim 1, wherein the p-type nitride semiconductor layer is grown for a p-type operating layer of a transistor.

9. The method for manufacturing a nitride semiconductor device according to claim 1, wherein the method further comprises, prior to growing the plurality of nitride semiconductor layers by MOCVD method, growing a single crystal buffer layer on the substrate by plasma laser deposition method, wherein the single crystal buffer layer is made of $Al_xGa_yIn_{1-x-y}N$ ($0 \leq x \leq 1$, $0 \leq y \leq 1$ and $0 \leq x+y \leq 1$), wherein both a-axis and c-axis of the $Al_xGa_yIn_{1-x-y}N$ are aligned respectively, and wherein the single crystal buffer layer is not lattice-matched with the plurality of nitride semiconductor layers.

* * * * *